1ucigaretteUS008550372B2

(12) United States Patent
Shedd et al.

(10) Patent No.: US 8,550,372 B2
(45) Date of Patent: *Oct. 8, 2013

(54) FULL COVERAGE SPRAY AND DRAINAGE SYSTEM AND METHOD FOR ORIENTATION-INDEPENDENT REMOVAL OF HIGH HEAT FLUX

(75) Inventors: Timothy A. Shedd, Madison, WI (US); Adam G. Pautsch, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1381 days.

This patent is subject to a terminal disclaimer.

(21) Appl. No.: 11/070,683

(22) Filed: Mar. 2, 2005

(65) Prior Publication Data

US 2006/0196627 A1 Sep. 7, 2006

(51) Int. Cl.
*B05B 17/04* (2006.01)
*B05B 9/00* (2006.01)
*A01G 25/02* (2006.01)
*H05K 7/20* (2006.01)
*F28D 3/00* (2006.01)

(52) U.S. Cl.
USPC ............. 239/11; 239/66; 239/124; 361/699; 62/171

(58) Field of Classification Search
USPC ............. 239/11, 66, 124, 126, 461, 476, 128, 239/132, 132.1, 132.3, 132.5; 62/259.2, 62/171; 361/699
See application file for complete search history.

(56) References Cited

U.S. PATENT DOCUMENTS

| | | | |
|---|---|---|---|
| 5,220,804 A | 6/1993 | Tilton et al. | |
| 5,860,602 A | 1/1999 | Tilton et al. | |
| 5,880,931 A | 3/1999 | Tilton et al. | |
| 5,907,473 A * | 5/1999 | Przilas et al. | 361/699 |
| 6,016,969 A | 1/2000 | Tilton et al. | |
| 6,104,610 A | 8/2000 | Tilton et al. | |
| 6,108,201 A | 8/2000 | Tilton et al. | |
| 6,349,554 B2 * | 2/2002 | Patel et al. | 62/259.2 |
| 6,498,725 B2 * | 12/2002 | Cole et al. | 361/700 |
| 6,595,014 B2 * | 7/2003 | Malone et al. | 62/171 |
| 6,952,346 B2 * | 10/2005 | Tilton et al. | 361/699 |
| 7,082,778 B2 * | 8/2006 | Patel et al. | 62/259.2 |
| 7,180,741 B1 * | 2/2007 | Knight et al. | 361/699 |
| 7,251,139 B2 * | 7/2007 | Bhattacharya et al. | 361/719 |
| 7,299,647 B2 * | 11/2007 | Tilton et al. | 62/259.2 |
| 2003/0172669 A1 | 9/2003 | Tilton et al. | |
| 2004/0032274 A1 | 2/2004 | Cader et al. | |
| 2004/0050545 A1 | 3/2004 | Tilton | |
| 2004/0060313 A1 | 4/2004 | Tilton et al. | |
| 2004/0089008 A1 | 5/2004 | Tilton et al. | |
| 2004/0089743 A1 | 5/2004 | Tilton et al. | |
| 2004/0194492 A1 | 10/2004 | Tilton et al. | |

\* cited by examiner

*Primary Examiner* — Len Tran
*Assistant Examiner* — Justin Jonaitis
(74) *Attorney, Agent, or Firm* — Joseph T. Leone, Esq.; Daniel A. Blasiole; DeWitt, Ross & Stevens, S.C.

(57) ABSTRACT

A cooling system and method that significantly improves spray evaporative cooling by using arrays of slot or plane sprays to create coverage of the entire heated surface to be cooled without allowing interaction between plumes that are spraying from the nozzles. The sprays are directed at an angle to the surface to take advantage of the high droplet momentum possessed by the spray to direct a flow of coolant fluid across the surface toward desired draining points, thereby enabling drainage regardless of the orientation of the unit.

24 Claims, 5 Drawing Sheets

FULL COVERAGE SPRAY AND DRAINAGE SYSTEM AND METHOD FOR ORIENTATION-INDEPENDENT REMOVAL OF HIGH HEAT FLUX

This invention was made with United States government support awarded by the following agencies: NSF 0134510. The United States has certain rights in this invention.

FIELD OF THE INVENTION

This invention pertains generally to spray cooling or spray evaporative cooling systems and methods, and more particularly to such systems and methods as used to cool electronic circuitry in high-performance computers and similar systems.

BACKGROUND OF THE INVENTION

Removal of heat from electronic circuitry has become one of the limiting factors in the design and performance of most computer systems and many other electronic devices. Power dissipation of a computer increases approximately as the operating frequency squared. Thus, doubling the clock speed, roughly doubling computer system performance, will require nearly four times the power dissipation. Without further innovation in the area of heat removal the development of a next generation computer design will be hampered.

One of very few practical ways to remove heat generated in the processing modules of very high-speed high-performance computers (supercomputers) is by spraying a thin layer of liquid directly onto the computer chips. Heat is then transported from the surface by heating the flowing liquid and by boiling off some fraction of the liquid (two phase cooling). This method of heat removal is known as spray cooling, or spray evaporative cooling, and is a very efficient method of removing very high heat fluxes from small surfaces. Thus, spray evaporative cooling is growing in prominence and application in the cooling of electronics and laser diodes because of the need for high heat transfer in a small area in such applications.

The physical mechanisms of spray evaporative cooling are not completely understood. However, current research based on single nozzle spray systems suggests that less than 50% of the heat is removed through nucleate boiling, similar to boiling a pot of water on a stove. More than 50% of the heat is removed either directly by heating the flowing liquid film or by evaporation at the surface of the film. It also has been shown that the heat flux increases both with the area of the heated surface directly covered by the spray and by the flux of spray droplets impinging on the surface.

Current spray cooling systems and methods operate by spraying a dielectric fluid, e.g., Fluorinert 72 (FC-72), at a normal or other angle directly onto computer chips, from either above or below the chips, using a cone shaped spray. The objective is to create a thin film of cooling fluid on the surface to be cooled to remove heat through single phase and two phase convection. While such systems are adequate for most current computer systems and other electronic applications, the ability of such systems to remove heat has been pushed to its limits. For example, in such systems multiple nozzles often are used to direct multiple cone shaped cooling fluid sprays onto a surface to be cooled to increase the total spray droplet flux impinging on the surface. However, in such systems the plumes of fluid that are sprayed from the nozzles tend to interact to create pockets of relatively low cooling fluid momentum, where the fluid tends to build up and where boiling often occurs. During the cooling process bubbles are generated that cause greatly enhanced mixing so that the liquid surface temperature is raised to the point that a large amount of evaporation occurs there. Stagnation regions will stop the mechanical mixing, leading to bubble growth and dry out at the surface being cooled. Thus, the interaction of the sprays leads to inefficient cooling and liquid build-ups on the heated surface, creating regions of poor heat transfer and, therefore, non-uniform heat transfer across the surface of the chip. In the regions of poor heat transfer, the surface temperatures can rise significantly above the average surface temperature, causing the surface temperature to "run away", leading to catastrophic failure.

For optimal operation, it also is imperative that the coolant be removed from the spray region quickly and efficiently to prevent the buildup of warm liquid. Failures also can occur if the coolant liquid is not efficiently removed from the surface being cooled. Current spray cooling systems are limited in the ability to drain spray coolant after impacting a heated surface. In particular, in many such systems changing the orientation of the system even slightly will affect coolant drainage patterns, thereby adversely affecting the cooling ability of the system. This limits the application of current spray cooling systems in many applications where the system to be cooled is portable and thus subject to changes in orientation.

Thus, current spray cooling systems suffer from various limitations including low critical heat flux (burnout) conditions, non-uniform heat transfer over large areas (area coverage limitations), and orientation constraints due to draining patterns.

What is desired, therefore, is an improved evaporative spray cooling system and method in which a coolant is provided onto a surface to be cooled so as to maintain a uniform thin layer of coolant thereon, avoiding the creation of areas of interaction between coolant sprays from different spray nozzles that can result in coolant build up, poor heat transfer, and possible circuit failure. What also is desired is an improved evaporative spray cooling system and method in which the uniform thin layer of coolant and adequate coolant drainage are maintained despite variations in orientation of the system being cooled thereby.

SUMMARY OF THE INVENTION

The present invention provides a spray cooling system and method that significantly improves spray evaporative cooling by creating a directed momentum flow of cooling fluid across a surface to be cooled. In accordance with the present invention, a spray of cooling fluid is directed directly onto the surface of a work piece to be cooled at an angle with respect to the work piece surface so as to create a flow of cooling fluid in a substantially single direction along the work piece surface. The spray of cooling fluid preferably may be delivered via a plurality of generally fan shaped sprays. The sprays are positioned and aligned to create cooling fluid coverage of the entire heated surface to be cooled without allowing interaction between the spray plumes in a manner that may cause areas of cooling fluid stagnation on the surface.

A full coverage spray and drainage system in accordance with the present invention may be implemented in an otherwise conventional spray cooling system including a reservoir of an appropriate cooling fluid (e.g., Fluorinert-72 for the cooling of electronic circuitry, preferably saturated with a non-condensable inert gas, such as nitrogen), a pump for delivering the cooling fluid under pressure from the reservoir to a spray chamber to be sprayed therein from nozzles onto the work piece to be cooled, and appropriate filtering, metering, and control systems. Cooling fluid is returned from the spray chamber to the coolant reservoir via a drainage point or points in the spray chamber. In accordance with the present invention, the drainage point or points in the spray chamber may be positioned with respect to the coolant supply such that the flow of cooling fluid directed in a substantially single direction along the work piece surface also is directed toward the drainage point or points. Thus, the cooling fluid momentum directs the fluid toward the drainage point, thereby assuring proper drainage of the cooling fluid despite changes in the orientation of the cooling system.

The spray nozzles used in accordance with the present invention preferably provide generally fan shaped sprays directed at an angle toward the work piece surface. In the longer dimension thereof, the fan shaped sprays preferably correspond to the width (in the direction perpendicular to the fluid flow) of the work piece surface to be cooled. Preferably a sufficient plurality of such fan shaped sprays are employed in a spaced apart relation along the length (in the direction of the fluid flow) of the work piece surface to be cooled such that a continuous flow of a thin film of cooling fluid in a substantially single direction is created across the work piece surface. Preferably the sprays are far enough apart so as not to interact with each other (in the direction of the fluid flow) either at the surface of the work piece or before contacting the work piece surface. Thus, full coverage of the work piece surface to be cooled by flowing cooling fluid is achieved, while the creation of stagnation areas resulting from interaction of the spray plumes is avoided.

The spray nozzles to be used in accordance with the present invention may be formed as slots formed at an angle in the wall of a small tube. A small orifice is formed in the tube wall within of each such slot to connect the angled slot in fluid communication with the tube bore. When pressurized cooling fluid is provided to the tube bore, from either one or both ends of the tube, the fluid is expelled in a fan shaped spray pattern at an angle from the slots formed in the tube. An array may be formed of a plurality of such tubes, with such slot nozzles formed therein, positioned side by side such that the fan shaped sprays provided by the tubes in the array extend across the width of a chip or other surface to be cooled. The length of the tubes in the array may be selected to correspond to the length of the chip or other surface to be cooled. Cooling fluid may be provided under pressure to either or both ends of the tubes in the array via appropriate manifolds.

In an alternative embodiment, the spray nozzles to be used in accordance with the present invention may be formed as a plurality of parallel slot shaped nozzles formed at an angle through a spray plate. The longer dimension of each such slot shaped nozzle preferably corresponds approximately to a width dimension of the surface to be cooled. Each such nozzle generates a substantially fan shaped spray of cooling fluid when cooling fluid under pressure is provided thereto. Alternatively, a spray nozzle to be used in accordance with the present invention may be formed using linear arrays of small nozzle orifices formed at an angle through a spray plate. Each such linear array may generate a fan shaped spray similar to that generated by a slot shaped nozzle. An appropriate dispersion or swirling structure preferably is provided adjacent to such slot shaped or linear array spray nozzles, to assure that a spray of cooling fluid droplets, rather than a continuous jet flow of cooling fluid, is developed from the nozzles.

By maintaining a thin layer flow of coolant in a substantially single direction over an entire heated surface to be cooled, thereby preventing the build up of liquid anywhere on the surface, a full coverage spray and drainage system in accordance with the present invention will provide significantly enhanced spray cooling performance for the next generation of computers, as well as for a wide range of other applications, and will remove system orientation constraints. Further objects, features, and advantages of the present invention will be apparent from the following detailed description taken in consideration with the accompanying drawings.

DETAILED DESCRIPTION OF THE INVENTION

The present invention will be described in detail herein with reference to the use thereof for the cooling of electronic circuits and electronic devices, particularly microelectronic circuitry as employed in computer systems, such as high-speed, high-performance computer systems (supercomputers). However, it should be understood that the present invention also may be applied in other applications, such as in the biomedical industry and for the cooling of laser arrays and high powered weaponry, etc. Spray evaporative cooling in accordance with the present invention may be applied to cryogenic devices, as an aid to laser-assisted surgical procedures, etc. It should also be understood that various cooling fluids other than those described herein, and combinations thereof, may be used in a full coverage spray and drainage system in accordance with the present invention.

A full coverage spray and drainage system and method in accordance with the present invention may be implemented in an otherwise conventional system 10 for providing sprayed coolant onto a work piece to be cooled. An exemplary system 10 of this type is illustrated schematically in FIG. 1, and will be described in detail with reference thereto. The work piece to be cooled may, for example, be a microelectronic circuit chip in a supercomputer, or any other electronic circuit or device, such as a diode laser package, or other work piece or surface for which the improved heat flux removal provided by a system and method in accordance with the present invention is desired or required.

Figure 1:
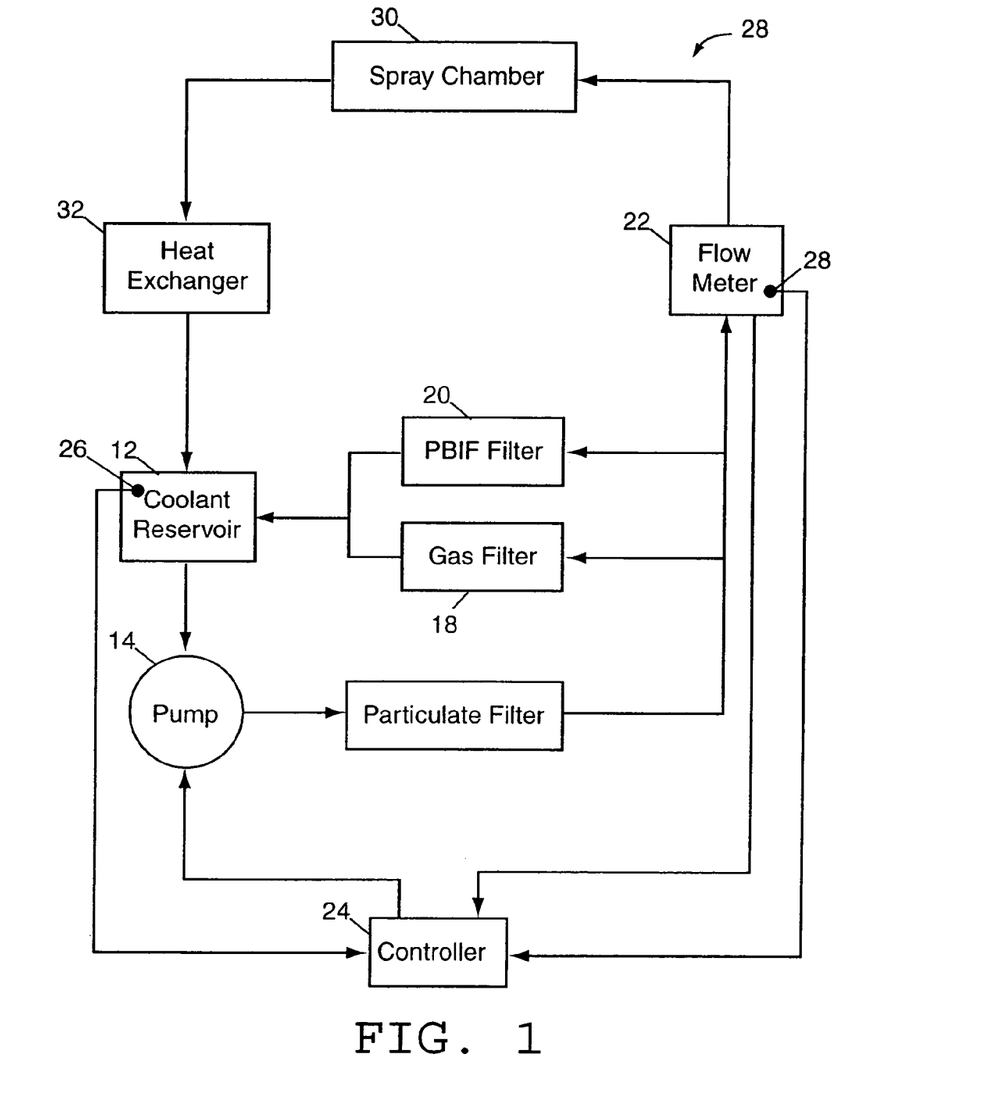
FIG. 1 is a schematic block diagram of an exemplary system for spraying a coolant fluid onto a work piece in which a full coverage spray and drainage system in accordance with the present invention may be implemented.

The liquid coolant to be employed is stored in a coolant reservoir 12. An appropriate conventional reservoir 12 may be selected for the particular coolant to be employed. An exemplary coolant fluid that may be employed for cooling electronic circuitry is Fluorinert-72 (FC-72), commonly available from 3M Corporation, although other similar or different dielectric or other coolant fluids, or combinations thereof, may be employed, depending upon the particular application. The coolant fluid preferably is degassed and filtered before being placed in the reservoir 12 of the fully evacuated system 10. The system 10 preferably may be pressurized, e.g., to 1 atmosphere, with nitrogen gas, which causes partial fluid saturation. It has been found that using nitrogen-saturated FC-72 enhances cooling performance. (Nitrogen is remarkably soluble in FC-72.)

An appropriate pump 14 is employed to pump the cooling fluid through the system 10. For example, for FC-72, a magnetically coupled gear pump or a similar pump may be employed.

Appropriate filters and absorbers preferably are employed to remove any particles 16 or foreign gases 18, including water vapor, from the coolant fluid. An absorber 20 preferably also is employed to remove perfluoroisobutylene (PFIB) from the coolant fluid. PFIB is a harmful compound that can result from Fluorinert breakdown at extremely high heat levels.

The coolant fluid flow preferably is passed through a conventional appropriate flow meter 22 that measures, e.g., the volumetric flow rate of the coolant. Rate of flow data from the flow meter 22 may be provided in a conventional manner to a system controller 24. Additional system operation information that preferably may be provided to the controller 24 may include system pressure and coolant fluid temperature. System pressure information may be provided to the controller 24 via a conventional and appropriate pressure sensor 26 mounted in the system, e.g., in the coolant fluid reservoir 12. Coolant fluid temperature information may be provided by one or more conventional and appropriate temperature sensors 28. Preferably at least one temperature sensor 28 is positioned to measure the temperature of the coolant fluid flow just before the coolant fluid enters the spray chamber 30, wherein the coolant fluid is sprayed onto the work piece to be cooled. For example, as illustrated in FIG. 1, a temperature sensor 28 may be implemented as part of, or separate from, the coolant fluid flow meter 22.

Based on coolant fluid flow rate, pressure, and temperature feedback information, as well as any other or different feedback information as may be provided, such as the measured temperature of the work piece to be cooled, the controller 24 may control operation of the pump 14 to provide coolant fluid at the desired pressure from the reservoir 12 to the spray chamber 30 to be sprayed on a work piece in a manner in accordance with the present invention to cool the work piece therein. The controller 24 may be implemented in a conventional manner using conventional digital and/or analog circuitry to control the providing of coolant to the spray chamber 30 to provide the desired cooling for a work piece therein. Note that for application in a computer or other similar system, the controller 24 may be implemented, at least in part, in microelectronic circuitry located in the spray chamber 30 that is cooled by the system 10 under control of the controller 24.

The spray chamber 30 designates the portion of the system 10 wherein the coolant fluid is sprayed onto a work piece to be cooled. For computer system applications, for example, the spray chamber 30 is a section of the computer system containing electronic circuitry to be cooled by the coolant fluid. However, the spray chamber 30 may be any closed or open area containing a work piece to be cooled by a coolant fluid in accordance with the present invention.

Coolant fluid sprayed in the spray chamber 30 is drained therefrom and returned to the coolant reservoir 12 via a heat exchanger 32. Any conventional and appropriate heat exchanger 32 device, system, or structure may be employed for this purpose.

An exemplary method and structure in accordance with the present invention for spraying coolant fluid onto a work piece to be cooled to achieve improved removal of high heat flux therefrom will be described now in detail with reference to FIGS. 2 and 3. The method and structure to be described may take place and be positioned in the spray chamber 30 portion of the exemplary system 10 described above with reference to FIG. 1. The coolant fluid illustrated in, and described with reference to, FIGS. 2 and 3, thus may be provided to the structure described with reference to FIGS. 2 and 3 by the system 10 and method described above with reference to FIG. 1.

A work piece 40 to be cooled may be, for example, an integrated circuit chip or other electronic or non-electronic device or structure. The work piece 40, as illustrated, is relatively thin in thickness. To cool the work piece 40, e.g., during operation thereof, a coolant fluid 42 is sprayed on at least one of the relatively flat and broad larger substantially two-dimensional surfaces of the work piece 40. For purposes of this example, the broad surface of the work piece 40 onto which the coolant fluid 42 is sprayed will be referred to as the top surface 44 thereof. Note that for an integrated circuit chip work piece 40 the surface 44 thereof to be cooled may be a surface of the chip itself, a surface of packaging containing the chip, or the surface of a heat spreader or other structure mounted on the chip or chip package. The top surface 44 of the work piece 40 has two elongated dimensions which will be referred to, for example, as the length of the work piece (extending along the page in FIG. 2) and the width of the work piece (extending into the page in FIG. 2). Of course these terms are interchangeable, and it should be understood that the term "width" as used herein, including in the claims, may refer to any dimension of an integrated circuit chip or other work piece 40 or surface or area to be cooled in accordance with the present invention.

The work piece 40 may be mounted for operation in a spray chamber 30 in a conventional manner. It should be understood, for example that many integrated circuit chips and other electronic devices may be mounted in a spray chamber 30 for operation. Each such chip or other device or work piece may be cooled by a method and system in accordance with the present invention as described herein.

Figure 2:
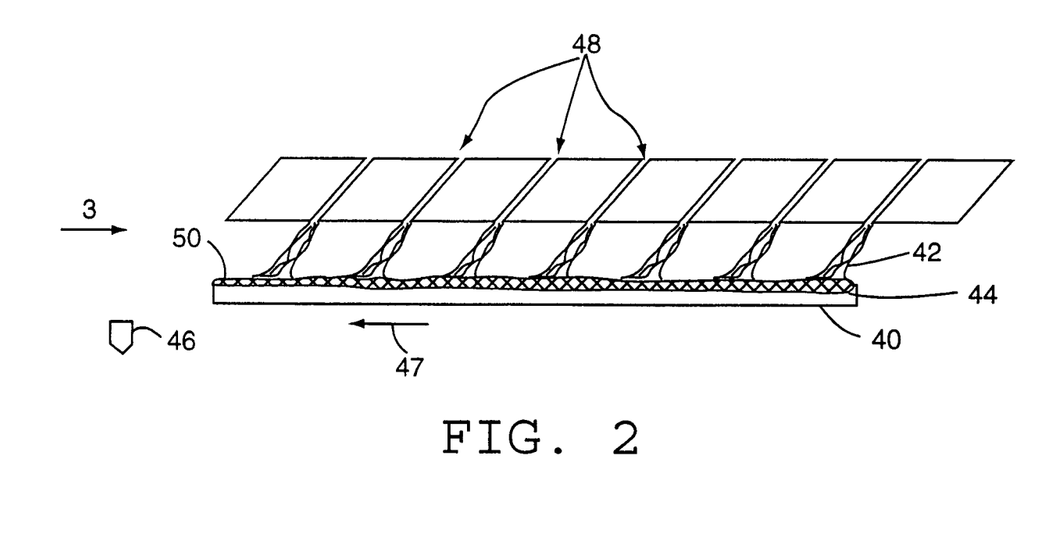
FIG. 2 is a detailed schematic illustration of an exemplary array of slot shaped coolant spray nozzles as employed in an exemplary full coverage spray and drainage system in accordance with the present invention, showing the orientation thereof with respect to a work piece being cooled by substantially fan shaped sprays of coolant from the nozzles.
Figure 3:
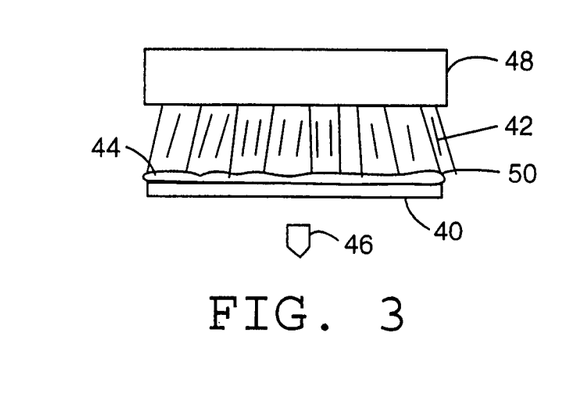
FIG. 3 is a view of the substantially fan shaped spray generated by the nozzles illustrated in FIG. 2, as seen from the direction 3 of FIG. 2.

Within the spray chamber 30 there is provided at least one drain point 46, illustrated schematically in FIG. 2. The work piece 40, and particularly the top surface 44 thereof to be cooled, is in a certain position with respect to the drain point 46. As will be discussed in more detail below, in accordance with the present invention, coolant fluid 42 is sprayed onto the work piece 40 to cool the work piece 40 such that the coolant fluid flows across the top surface 44 of the work piece 40 in a substantially single direction 47. The drain point 46 may, therefore, preferably be positioned with respect to the work piece 40 such that the flow of the cooling fluid 42 from the work piece surface 44 is directed 47 toward the drain point 46 to be returned therefrom from the spray chamber 30 to the coolant fluid reservoir 12. By using the directed momentum flow of the cooling fluid 42 to direct the cooling fluid 42 toward the drain point 46, proper drainage of the cooling fluid 42 can be achieved despite changes in orientation of the cooling system 10.

In accordance with the present invention, a coolant fluid 42 is sprayed directly onto the surface 44 of the work piece 40 to be cooled to create a flow of cooling fluid 42 in a substantially single direction 47 along the work piece surface 44. This directed momentum flow 47 of cooling fluid 42 across the surface 44 of the work piece 40 is achieved by spraying the cooling fluid 42 onto the surface 44 at an angle with respect thereto via one or more spray nozzles 48.

In accordance with the present invention, the spray nozzles 48 are positioned to spray the coolant fluid 42 directly onto the surface 44 of the work piece 40 to be cooled, rather than transversely across or indirectly onto the surface 44 of the work piece 40. The nozzle openings preferably are positioned with respect to the surface 44 of the work piece 40 such that lines extending perpendicularly from the surface 44 of the work-piece 40 will intersect the nozzle openings. In other words, the nozzles 48 preferably are located directly "above" the work piece 40 to be cooled. (Although it should be understood that the combination of the work piece 40 and nozzles 48 may be oriented together in space vertically side by side or in some other orientation.) The distance between the spray nozzle 48 openings and the surface 44 of the work piece 40 to be cooled preferably may be in the range of 3-5 mm, although other distances therebetween also may be employed in accordance with the present invention.

In accordance with the present invention, the spray nozzles 48 preferably generate a substantially fan shaped spray 42 of cooling fluid. That is, as illustrated in FIGS. 2 and 3, a spray shape that is significantly longer in a first direction than in a second, perpendicular, direction. This is in contrast to the generally cone shaped spray provided in conventional spray cooling systems. For example, such a substantially fan shaped spray may be generated using slot shaped nozzles 48. Preferably, the slot shaped spray nozzles 48 may be, in their longer dimension, approximately as wide as the chip or other work piece 40 to be cooled, such that the fan of coolant spray 42 provided by the nozzle 48 extends across the surface 44 of the chip in one direction. (Full coverage across the width of the work piece surface 44 may be achieved using a smaller slot providing a greater fan-out of spray in the longer dimension, although this is not preferred.) Thus, for example, a slot shaped spray nozzle 48 having a nozzle orifice width in the shorter dimension of significantly less than 100 microns, and preferably about 4 microns, and a nozzle orifice width in the other dimension of 15-25 mm may be used to spray coolant onto the surface of a conventional integrated circuit chip that is 15-25 mm across, such that the spray provided thereby extends across the surface 44 of the chip 40. (A very narrow orifice width preferably is used both to limit the spread of the spray in the dimension along the length of the work piece 40 being cooled as well as to keep the total orifice size (width times length) on the same order of magnitude as that of conventional cone shaped spray nozzles with circular orifices typically 150-200 microns in diameter. This allows coolant fluid pressures and flow rates per nozzle similar to those used in conventional spray cooling systems to be used in a spray cooling system and method in accordance with the present invention.)

Preferably a plurality of spray nozzles 48 for cooling a given work piece 40 are aligned along a single axis extending along the length of the work piece 40. The spray nozzles 48 preferably are aligned such that the longer dimensions of the nozzle orifices are perpendicular to this axis, and are spaced apart from each other along this axis sufficiently such that the spray of coolant fluid 42 provided by each of the spray nozzles 48 doesn't interfere with the spray provided by any of the other adjacent spray nozzles 48. In other words, as illustrated in FIG. 2, the substantially fan shaped coolant sprays 42 from adjacent nozzles 48 preferably do not cross or intersect either at the surface 44 to be cooled or before the sprays 42 contact the surface 44. By preventing interaction of the cooling fluid sprays 42, areas of fluid flow stagnation on the surface 44 of the work piece 40 being cooled are avoided.

In accordance with the present invention, the spray nozzles 48 are oriented so as to direct the cooling fluid 42 directly onto the surface 44 of the work piece 40 to be cooled at an angle with respect thereto. For example, an angle of between approximately 30 and 60 degrees with respect to the surface 44 of the work piece 40, and preferably an angle of approximately 45 degrees, may be employed. All of the nozzles 48 directing fluid at a single work piece 40 preferably are oriented at the same angle with respect thereto, to prevent crossing or other interaction of the sprays 42 provided thereby. Varying angles may be used, however, in some cases, to control the rate of flow of coolant fluid across the surface 44 of the work piece 40.

Sufficient nozzles 48, each configured and oriented as describe above, preferably are provided for each chip or other work piece 40 to be cooled, such that the combined spray of coolant 42 on the surface 44 of the work piece 40 maintains a full coverage thin film 50 of cooling fluid 42 on the surface 44. (This is achieved even though the entire surface 44 to be cooled is not covered by the areas of the sprays 42 themselves.) Depending on the coolant fluid flow rate, heat flux to be removed, etc., one nozzle every 5 mm or so along the chip or other work piece 40 may be sufficient. For example, for cooling a typical integrated circuit chip, a flow rate of approximately 1 ml/second for each nozzle may be employed. Thus, the total flow rate across the chip or other work piece 40 to be cooled is the flow rate per nozzle multiplied by the number of nozzles employed.

Coolant fluid 42 sprayed onto the surface 44 of a work piece 40 in a manner in accordance with the present invention as just described creates a thin film 50 of coolant fluid thereon that flows continuously in a substantially single direction 47 across the surface 44, to cool the work piece 40 by the mechanisms and in the manner discussed above. Such a system and method for spray cooling in accordance with the present invention has several benefits over the round sprays used in conventional spray cooling systems. Since the angled fan-shaped sprays do not overlap, they create a directed uniform flow of fluid across the surface 44 and there are no stagnation points. Multiple sprays along the length of the surface 44 being cooled help break up growing bubbles, suppressing the occurrence of critical heat flux. The angled sprays provide momentum to the fluid flow in a preferred substantially single direction 47. This does two things. First, it keeps the film 50 thinner and more uniform than it would be from a perpendicularly directed spray. Second, it allows the designer to direct the fluid for better drainage.

By directing cooling fluid flow in a substantially single direction across work pieces to be cooled, drainage patterns can be designed with some freedom. For instance, a drain trough could be placed around the perimeter of a spray chamber with the sprays directed at multiple work pieces being cooled in the chamber all directed outward. Alternatively, all of the sprays could be directed in one direction across several work pieces in a spray chamber so that the fluid drains to one side. (This results in the added complication that fluid from one side will interact with the other side, leading to non-uniformities in temperatures, which may be desirable in some situations.) With more even fluid momentum coverage, more even temperature distribution on the work pieces being cooled may be achieved. Since cooling fluid momentum and drainage are more controlled, a spray cooling system in accordance with the present invention will be less sensitive to varying orientations.

Figure 4:
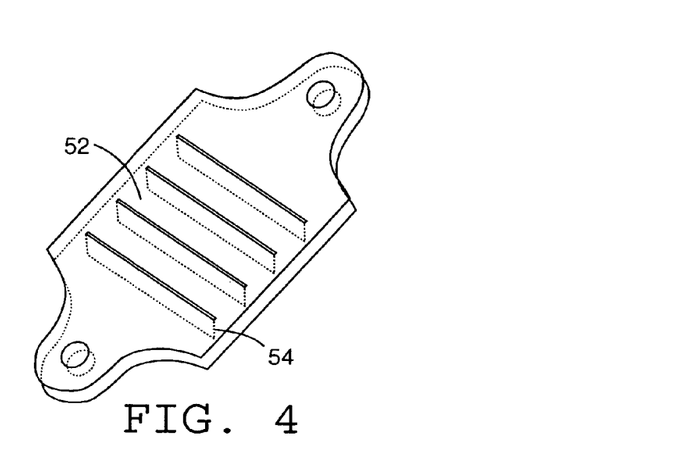
FIG. 4 is a perspective view of an exemplary spray plate having slots formed therethrough at an angle to form nozzles for generating substantially fan shaped sprays of coolant fluid for use in accordance with the present invention.

A spray nozzle for use in accordance with the present invention may be formed from a spray plate 52, as illustrated in FIG. 4. The spray plate 52 is made of a thin piece of metal or similar material that has a plurality of slots 54 formed therethrough at an angle to form nozzles for generating substantially fan shaped sprays as described above. The nozzle slots 54 may be formed through the spray plate 52 in a conventional manner, such as by etching, cutting, etc.

Figure 5:
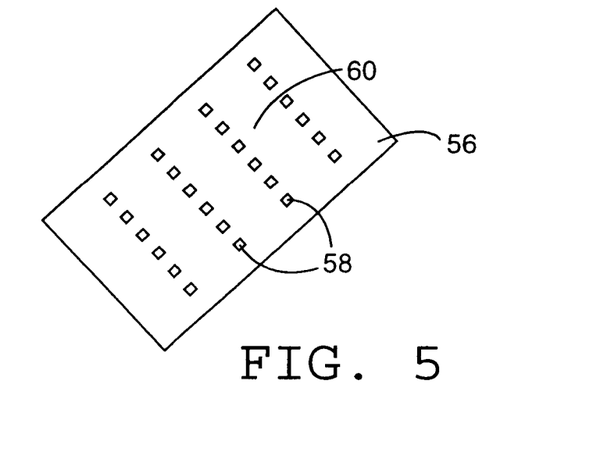
FIG. 5 is a plan view of an alternative exemplary embodiment of a spray plate having linear arrays of nozzle orifices formed therethough at an angle such that each linear array of nozzle orifices generates a substantially fan shaped spray of coolant fluid for use in accordance with the present invention.

Alternatively, a spray nozzle for generating a substantially fan shaped spray for use in accordance with the present invention may be formed using a linear array of small nozzle orifices. For example, as illustrated in FIG. 5, a spray plate 56 may have formed therethrough a plurality of such linear arrays 58 of small nozzle orifices 60. The nozzle orifices 60 preferably may be generally circular, or have another appropriate shape. The nozzle orifices 60 are formed at an appropriate angle through the spray plate 56. Each linear array 58 of nozzle orifices 60 generates a substantially fan shaped spray similar to that generated by the slot shaped nozzles described above.

Figure 6:
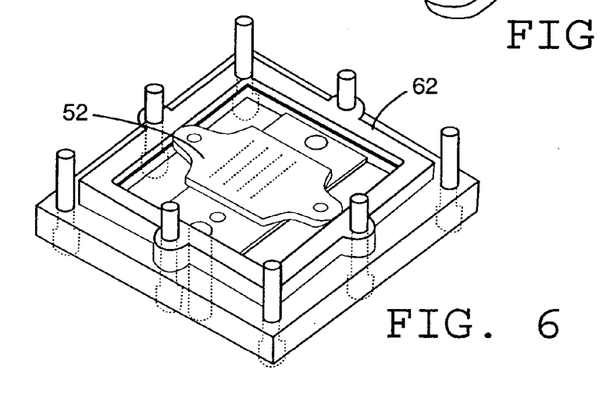
FIG. 6 is a perspective view of the exemplary spray plate of FIG. 4 as mounted on a spray plate holder.
Figure 7:
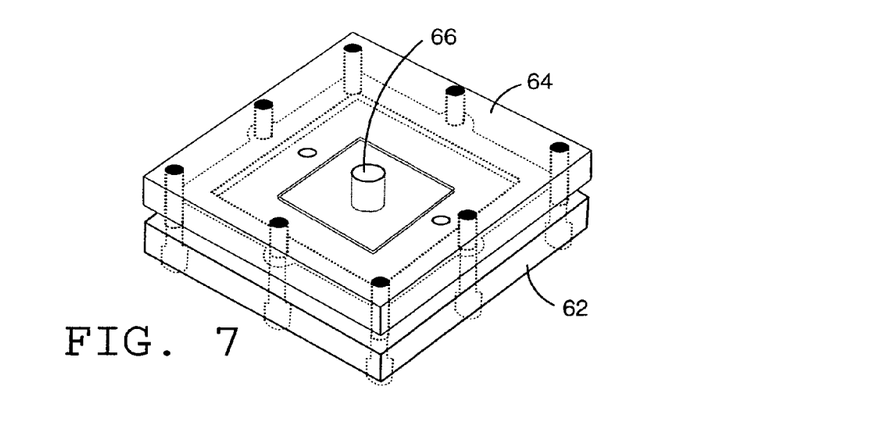
FIG. 7 is a perspective view of the exemplary spray plate and holder of FIG. 6 with a cover piece attached thereto, the cover piece having an orifice formed therein for providing cooling fluid under pressure to the spray plate.

For use in a spray cooling system in accordance with the present invention, the spray plate 52 (or 56), having the slot shaped 54 (or linear array 58) nozzles formed therein, may be mounted on a spray plate holder 62, as illustrated in FIG. 6. The spray plate holder 62 is adapted to hold the spray plate 52 in a conventional manner such that the spray plate nozzles are aligned with an aperture or window (not shown in FIG. 6) in the holder 62 that is positioned adjacent to the work piece to be cooled. A cover plate 64 is mounted on the spray plate holder 62 over the spray plate 52 to form a chamber (not shown) between the spray plate 52 and the cover plate 64. The cover plate 64 has a cooling fluid inlet port 66 formed therein through which cooling fluid under pressure is admitted into the chamber between the spray plate 52 and the cover plate 64. This pressurized fluid is ejected through the spray plate nozzles in the desired substantially fan shape as described herein.

Figure 8:
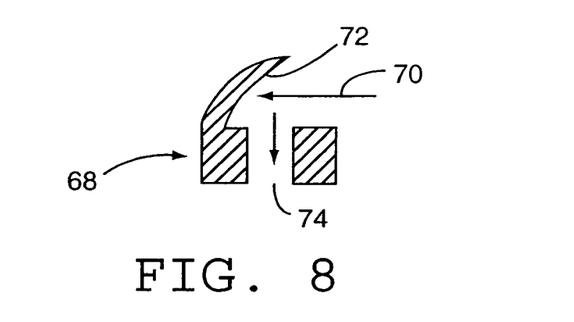
FIG. 8 is a schematic cross section view of an exemplary structure for dispersing or swirling pressurized cooling fluid before it is provided to a spray nozzle to assure that a spray of cooling fluid droplets, rather than a jet stream, is developed from the nozzle.

In order to achieve the desired cooling effect, it is important that the cooling fluid spray emitted from the spray nozzles be a spray of cooling fluid droplets, rather than a continuous jet flow of cooling fluid. To ensure the creation of a spray of droplets, the pressurized cooling fluid should be dispersed or swirled before or after being emitted through the spray nozzles. Conventional dispersing or swirling structures, such as a screen or multiple slots, may be used for this purpose. For example, a screen may be used to disperse the cooling fluid either immediately after it is ejected from a spray nozzle or immediately before being provided to the spray nozzle. An exemplary structure 68 for dispersing or swirling cooling fluid is illustrated in cross section in FIG. 8. In this structure 68, cooling fluid 70 is directed under pressure against a curved surface 72 that disperses and swirls the cooling fluid 70 before it is directed through an aperture 74 to the spray nozzles to be sprayed therefrom. Note that any appropriate structure may be employed to ensure that the spray nozzles used in a spray cooling system in accordance with the present invention provides a spray of cooling fluid droplets, rather than a continuous jet stream.

Figure 9:
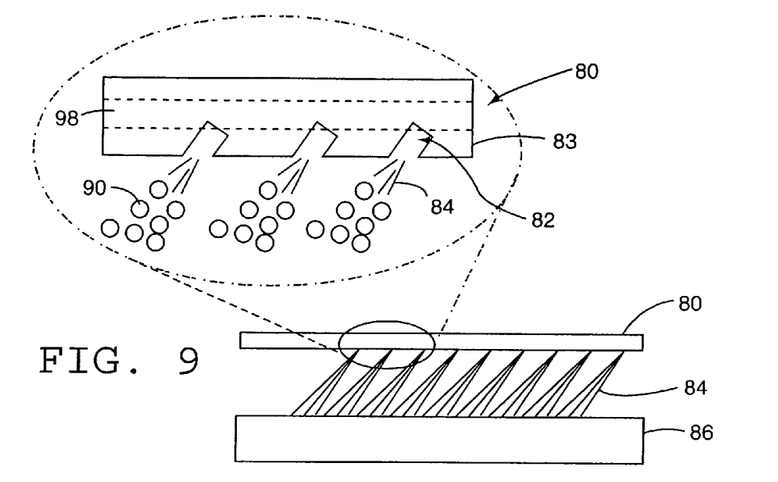
FIG. 9 is a detailed schematic illustration, in side view and enlarged partial cross section, of an exemplary and preferred structure for generating fan shaped sprays of cooling fluid from angled slots formed in a tube, as may be employed to cool a work piece in a full coverage spray and drainage system in accordance with the present invention.

An alternative and currently preferred spray nozzle for use in accordance with the present invention may be formed from a small tube 80. For example, as illustrated in FIG. 9, conventional metal microbore tubing 80 may be used for this purpose. Such tubing 80 may, for example, typically have an outer diameter on the order of $1/16$ inch, with a tube wall thickness of approximately $1/64$ inch. (It should be understood that microbore or other tubing having different dimensions also may be used.) In accordance with the present invention, one or more spray nozzles are formed along the length of the tube 80 by cutting (e.g., using a slitting saw), stamping, or otherwise forming one or more slots 82 at an angle into the wall 83 of the tube. (The method used for forming the slots 82 in the tube 80 preferably may form a relatively rough slot well. The resulting rough surfaces in and around the slot well 82 help to increase the production of spray droplets 90 forming the cooling fluid spray 84 formed by the slots 82.) The slots 82 preferably are formed at a desired angle into the wall 83 of the tube 80 to correspond to the desired angle at which a spray 84 of cooling fluid to be generated from the nozzles formed thereby is to be directed at the surface of a work piece 86 to be cooled. Thus, the slots 82 preferably may be formed at an angle of between 30° and 60° into the wall 83 of the tube 80. The slots 82 may be formed at a depth through the wall 83 of the tube 80 such that the slots 82 are in fluid communication with the tube bore 88. Alternatively, and preferably, the slots 82 may be formed partially through the tube wall 83 and a small hole or other aperture drilled, punched, or otherwise formed in the slot 82 to connect the slot 82 in fluid communication with the tube bore 88. The width of the slot 82 is selected such that, when pressurized cooling fluid is provided to the tube bore 88, from either or both ends of the tube 80, a fan shaped spray 84 of cooling fluid is directed from the slot 82 formed in the tube 80 at the desired angle. For example, a slot width of approximately 150 micrometers may be used. A plurality of slots 82 preferably are formed spaced apart along the length of the tube 80 such that the sprays 84 of cooling fluid formed by the slots 82 do not interact before contacting, or at the surface of, the work piece 86 being cooled.

Figure 10:
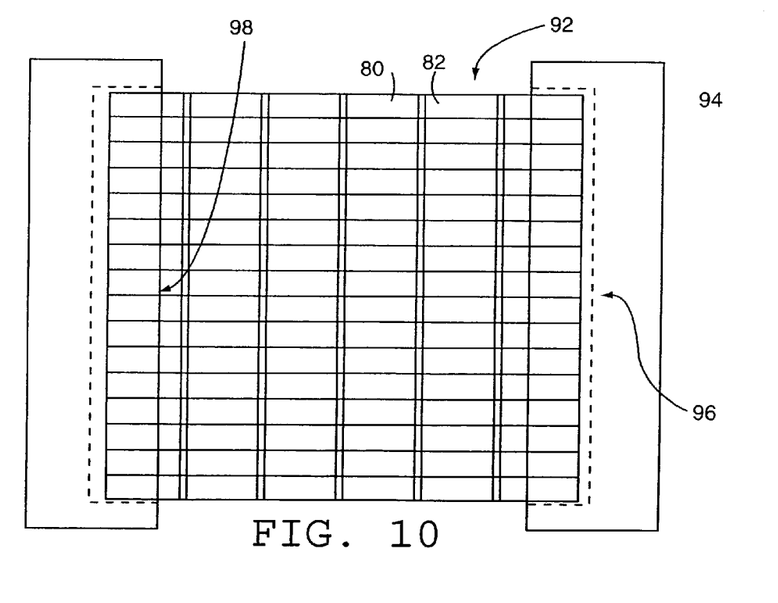
FIG. 10 is a plan view of an array of tubes with angled slots formed therein as illustrated in FIG. 9 as may be used to generate fan shaped sprays of cooling fluid to provide full coverage across of a surface to be cooled in a full coverage spray and drainage system in accordance with the present invention, including manifolds for providing cooling fluid under pressure to the array of tubes.

As illustrated in FIG. 10, a plurality of nozzle tubes 80 as described above with respect to FIG. 9 may be formed in an array 92 and used to provide full coverage spray cooling of a work piece in accordance with the present invention. For example, the size of the array 92 of tubes 80 may correspond approximately to the size of the work piece surface to be cooled. Thus, the lengths of the tubes 80 in the array 92 may be selected to correspond to the length of a work piece surface to be cooled, with sufficient tubes 80 placed side-by-side in the array such that the width of the array 92 corresponds to the width of a work piece surface to be cooled. The tubes 80 forming the array 92 are positioned such that the slots 82 formed in adjacent tubes 80 are aligned across the width of the array 92. Thus, adjacent slots 82 in adjacent tubes 80 across the width of the array 92 form a linear array of nozzle orifices that may be used to produce, in combination, a fan shaped spray of cooling fluid that extends across the width of a work piece surface to be cooled. As discussed above, the slots 82 preferably are formed spaced apart along the length of each tube 80 in the array 92 such that arrays of adjacent slots 82 in adjacent tubes 80 across the width of the tube array 92 are separated from each other by sufficient distance such that the fan shaped sprays of cooling fluid generated thereby do not interact before contacting, or at the surface of, the work piece being cooled. (E.g., the rows of adjacent slots 82 formed in the tubes 80 may be separated by approximately 5 mm.)

Pressurized cooling fluid may be provided to the array 92 of nozzle tubes 80, at either or both ends thereof, via one or more manifold structures 94. For example, the manifold structures 94 may be formed of an appropriate metal or plastic material with a slot 96 formed therein for receiving the ends of the tubes 80 forming the array 92. (For example, for an array 92 formed using microbore tubes 80 having an outer diameter of 1/16 inch, an approximately 5/64 inch wide slot 96 may be formed in the manifold 94, e.g., using a ball-end mill, to a depth of approximately 4 mm, to support the tube array 92 therein.) An appropriate epoxy 98 may be used to seal the ends of the tubes 80 in the slot 96 formed in the manifold 94. Pressurized cooling fluid thus may be provided to either or both ends of the array 92 of nozzle tubes 80 via the manifolds 94 and the slots 96 formed therein in which the ends of the tubes 80 are mounted and sealed.

The tubes 80 forming the array 92 of tubes 80 may be positioned closely adjacent to each other, as illustrated in FIG. 10. Alternatively, the tubes 80, or some of the tubes 80, in the array 92 may be spaced slightly apart (but preferably not so far apart such that a continuous fan shaped spray across the width of the work piece being cooled by the array 92 is not provided at the surface of the work piece). The resulting gap between adjacent tubes 80 may be used conveniently to vent cooling fluid vapor away from the work piece being cooled. Vapor vent tubes, with vent apertures formed therein, may be positioned in the gaps between nozzle tubes 80 in the array 92 to provide this vapor venting function.

Figure 11:
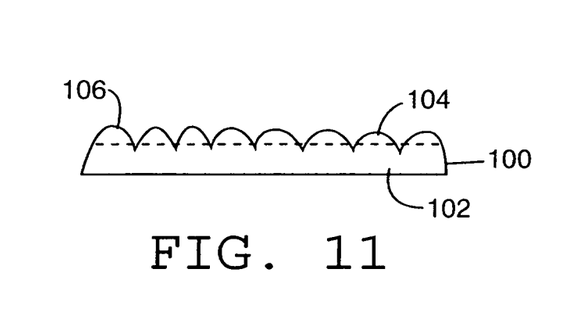
FIG. 11 is a cross-section illustration of another exemplary structure that may be used to form fan shaped sprays of cooling fluid to provide full coverage across a surface to be cooled in a full coverage spray and drainage system in accordance with the present invention.

An array of spray nozzles for use in accordance with the present invention alternatively may be formed from an elongated stamped, extruded, or otherwise formed structure 100 have a cross-section as illustrated, generally, for example, in FIG. 11. This structure 100 may be formed with a central bore 102, to which pressurized cooling fluid may be provided. At least one side of the structure 100 is formed to have a series of elongated raised adjacent semi-circular surfaces 104. (Thus, when viewed from above (in FIG. 11) the structure 100 appears similar to the tube array 92 illustrated in FIG. 10.) Slots 106 are cut across this surface 104 of the structure 100 at a desired angle and to an appropriate depth to form spaced apart rows of spray nozzles in fluid communication with the structure bore 102 along the length of the structure 100. Thus, the structure 100, when formed in this manner, may be used to generate fan shaped sprays of cooling fluid in a manner similar to that of the tube array 92 structure of FIG. 10. The size of the structure 100 preferably may be selected to correspond to the size of the work piece surface to be cooled, to provide full coverage spray cooling of the work piece surface in accordance with the present invention.

It should be noted that the structures illustrated in FIGS. 4-11 are appropriate for cooling a single integrated circuit chip or other work piece by spray cooling in accordance with the present invention. It should be understood that multiple spray nozzles for use in accordance with the present invention may be produced in a conventional manner as a laminated structure wherein the various structures described (nozzle openings, dispersion/swirl chamber, fluid input port, etc.) are formed in separate lamination layers that are joined together to form a nozzle structure for spraying multiple work pieces simultaneously.

It should be understood that the present invention is not limited to the particular exemplary applications and embodiments as illustrated and described herein, but embraces all forms thereof as come within the scope of the following claims.

What is claimed is:

1. A method for cooling a work piece having a surface, comprising:
   (a) providing a cooling fluid; and
   (b) directing a plurality of sprays of cooling fluid from a plurality of slot nozzles directly onto the surface of the work piece at an angle of between approximately 30 degrees and 60 degrees with respect thereto such that the spray of cooling fluid creates a flow of cooling fluid in a substantially single direction along the work piece surface, and wherein the plurality of sprays do not interact with each other either at the surface of the work piece or before contacting the surface of the work piece,
   wherein the plurality of sprays of cooling fluid are substantially fan-shaped sprays and wherein directing the plurality of fan-shaped sprays of cooling fluid directly onto the surface of the work piece includes providing the plurality of slot nozzles adjacent to the work piece surface and directing the plurality of fan-shaped sprays directly onto the surface of the work piece via the plurality of slot nozzles,
   wherein the plurality of slot nozzles are distributed along a length of at least one tube and the plurality of slot nozzles are oriented parallel to one another, the at least one tube including at least two of the plurality of nozzles.

2. The method of claim 1 wherein each substantially fan-shaped spray comprises a spray shape that is significantly longer in a first direction than in a second, perpendicular direction, wherein the first direction and the second direction are substantially orthogonal to the angle.

3. The method of claim 1 wherein the plurality of fan-shaped sprays have a spray width at the surface of the work piece corresponding approximately to a width of the surface of the work piece.

4. The method of claim 1 wherein the plurality of fan-shaped sprays are directed at substantially the same angle onto the surface of the work piece.

5. The method of claim 1 wherein the spray of cooling fluid is directed onto the surface of the work piece to create a flow of cooling fluid in a substantially single direction along an entire width of the work piece surface.

6. A method for cooling a work piece having a surface, comprising:
   (a) providing a cooling fluid; and
   (b) directing a plurality of substantially fan-shaped sprays of cooling fluid directly onto the surface of the work piece and at an angle of between approximately 30 degrees and 60 degrees with respect to the surface of the work piece to create a flow of cooling fluid in a substantially single direction along the work piece surface, wherein each substantially fan-shaped spray comprises a spray shape that is significantly longer in a first direction than in a second, perpendicular direction, wherein the first direction and the second direction are substantially orthogonal to the angle, and wherein the plurality of fan-shaped sprays do not interact with each other at the surface of the work piece or before contacting the surface of the work piece, wherein the plurality of sprays of cooling fluid are substantially fan-shaped sprays and wherein directing the plurality of fan-shaped sprays of cooling fluid directly onto the surface of the work piece includes providing the plurality of slot nozzles adjacent to the work piece surface and directing the plurality of fan-shaped sprays directly onto the surface of the work piece via the plurality of slot nozzles, wherein the plurality of slot nozzles are distributed along a length of at least one tube and the plurality of slot nozzles are oriented parallel to one another on the tube, the at least one tube including at least two of the plurality of nozzles.

7. The method of claim 6 wherein the plurality of fan-shaped sprays have a spray width at the surface of the work piece corresponding approximately to a width of the surface of the work piece.

8. The method of claim 6 wherein the plurality of fan-shaped sprays are directed at substantially the same angle onto the surface of the work piece.

9. The method of claim 6 wherein directing the plurality of fan-shaped sprays of cooling fluid directly onto the surface of the work piece includes providing a plurality of linear arrays of slot nozzles.

10. The method of claim 9 wherein the plurality of linear arrays of slot nozzles are formed in an array of tubes positioned adjacent to the work piece surface.

11. An apparatus for cooling a work piece having a surface, comprising:
 (a) a reservoir for containing a cooling fluid;
 (b) a plurality of nozzles adapted to produce a plurality of substantially fan-shaped sprays of cooling fluid when cooling fluid is provided under pressure to the plurality of nozzles; and
 (c) a pump coupled to the reservoir and to the plurality of nozzles for providing cooling fluid from the reservoir under pressure to the plurality of nozzles; and
 wherein the plurality of nozzles are adapted to be positioned with respect to a work piece to direct the plurality of substantially fan-shaped sprays of cooling fluid directly onto the surface of the work piece and at an angle of between approximately 30 degrees and 60 degrees with respect to the surface of the work piece to create a flow of cooling fluid in a substantially single direction along the work piece surface, wherein each substantially fan-shaped spray comprises a spray shape that is significantly longer in a first direction than in a second, perpendicular direction, wherein the first direction and the second direction are substantially orthogonal to the angle, and wherein the plurality of fan-shaped sprays do not interact with each other at the surface of the work piece or before contacting the surface of the work piece,
 wherein the plurality of nozzles includes at least one tube having a plurality of nozzle orifices distributed along a length of the tube at an angle there through, wherein each of the nozzles is oriented parallel to the other nozzles and each of the nozzles produces a fan-shaped spray of cooling fluid when the cooling fluid is provided under pressure to the plurality of nozzles.

12. The apparatus of claim 11 wherein the plurality of nozzles includes an array of tubes having a plurality of linear arrays of nozzle orifices formed at an angle therein.

13. The apparatus of claim 11 wherein the plurality of nozzles are adapted to be positioned with respect to a work piece to direct the plurality of substantially fan-shaped sprays at approximately the same angle onto the surface of a work piece.

14. The apparatus of claim 11 comprising additionally a drainage point coupled to the reservoir such that coolant fluid is directed from the drainage point back to the reservoir and wherein the drainage point is positioned with respect to the plurality of nozzles such that the flow of cooling fluid in a substantially single direction along the work piece surface is directed toward the drainage point.

15. The method of claim 11 wherein the plurality of nozzles are adapted to be positioned with respect to a work piece such that each of the plurality of substantially fan-shaped sprays has a spray width at the surface of the work piece corresponding approximately to a width of the surface of the work piece.

16. The method of claim 11 wherein the plurality of nozzles are adapted to be positioned with respect to a work piece to create a flow of cooling fluid in a substantially single direction along an entire width of the work piece surface.

17. An apparatus for cooling a work piece having a surface, comprising:
 (a) a reservoir for containing a cooling fluid;
 (b) a plurality of nozzles adapted to produce a plurality of substantially fan-shaped sprays of cooling fluid when cooling fluid is provided under pressure to the plurality of nozzles;
 (c) a pump coupled to the reservoir and to the plurality of nozzles for providing cooling fluid from the reservoir under pressure to the plurality of nozzles; and
 (d) a spray plate having the plurality of nozzles formed at an angle therein, the spray plate being in fluid connection with a fluid chamber into which pressurized cooling fluid is provided, wherein each of the plurality of nozzles produces a fan-shaped spray of cooling fluid when the cooling fluid is provided under pressure to the plurality of nozzles,
 wherein the plurality of nozzles are adapted to be positioned with respect to a work piece to direct the plurality of substantially fan-shaped sprays of cooling fluid directly onto the surface of the work piece and at an angle of between approximately 30 degrees and 60 degrees with respect to the surface of the work piece to create a flow of cooling fluid in a substantially single direction along the work piece surface, wherein each substantially fan-shaped spray comprises a spray shape that is significantly longer in a first direction than in a second, perpendicular direction, wherein the first direction and the second direction are substantially orthogonal to the angle, and wherein the plurality of fan-shaped sprays do not interact with each other at the surface of the work piece or before contacting the surface of the work piece.

18. The apparatus of claim 17 wherein the plurality of nozzles are adapted to be positioned with respect to a work piece to direct the plurality of substantially fan-shaped sprays at approximately the same angle onto the surface of a work piece.

19. The method of claim 17 wherein the plurality of nozzles are adapted to be positioned with respect to a work piece such that each of the plurality of substantially fan-shaped sprays has a spray width at the surface of the work piece corresponding approximately to a width of the surface of the work piece.

20. The method of claim 17 wherein the plurality of nozzles are adapted to be positioned with respect to a work piece to create a flow of cooling fluid in a substantially single direction along an entire width of the work piece surface.

21. A method for cooling a work piece having a surface, comprising:
(a) providing a cooling fluid; and
(b) directing a plurality of sprays of cooling fluid from a plurality of slot nozzles directly onto the surface of the work piece at an angle of between approximately 30 degrees and 60 degrees with respect thereto such that the spray of cooling fluid creates a flow of cooling fluid in a substantially single direction along the work piece surface, and wherein the plurality of sprays do not interact with each other either at the surface of the work piece or before contacting the surface of the work piece,
wherein the plurality of sprays of cooling fluid are substantially fan-shaped sprays and wherein directing the plurality of fan-shaped sprays of cooling fluid directly onto the surface of the work piece includes providing the plurality of slot nozzles adjacent to the work piece surface and directing the plurality of fan-shaped sprays directly onto the surface of the work piece via the plurality of slot nozzles,
wherein the plurality of slot nozzles are distributed along a length of a spray plate and are oriented parallel to one another, the spray plate being in fluid connection with a fluid chamber into which pressurized cooling fluid is provided.

22. The method of claim 21 wherein the plurality of fan-shaped sprays have a spray width at the surface of the work piece corresponding approximately to a width of the surface of the work piece.

23. The method of claim 21 wherein the plurality of fan-shaped sprays are directed at substantially the same angle onto the surface of the work piece.

24. The method of claim 21 wherein the spray of cooling fluid is directed onto the surface of the work piece to create a flow of cooling fluid in a substantially single direction along an entire width of the work piece surface.

* * * * *